(12) United States Patent
Schubert

(10) Patent No.: US 7,635,077 B2
(45) Date of Patent: Dec. 22, 2009

(54) METHOD OF FLIP CHIP MOUNTING PRESSURE SENSOR DIES TO SUBSTRATES AND PRESSURE SENSORS FORMED THEREBY

(75) Inventor: Paul C. Schubert, Cedarville, IL (US)

(73) Assignee: Honeywell International Inc., Morristown, NJ (US)

( * ) Notice: Subject to any disclaimer, the term of this patent is extended or adjusted under 35 U.S.C. 154(b) by 641 days.

(21) Appl. No.: 11/237,361

(22) Filed: Sep. 27, 2005

(65) Prior Publication Data

US 2007/0069000 A1    Mar. 29, 2007

(51) Int. Cl.
*H01L 21/52* (2006.01)
*B23K 35/12* (2006.01)

(52) U.S. Cl. ............. 228/123.1; 228/179.1; 228/124.6; 257/779; 438/612

(58) Field of Classification Search ............. 228/123.1, 228/179.1, 124.6; 438/612; 257/779
See application file for complete search history.

(56) References Cited

U.S. PATENT DOCUMENTS

| | | | |
|---|---|---|---|
| 4,548,078 A | 10/1985 | Bohrer et al. | 73/204 |
| 4,763,098 A | 8/1988 | Glenn et al. | 338/4 |
| 6,006,607 A | 12/1999 | Bryzek et al. | 73/727 |
| 6,140,144 A | 10/2000 | Najafi et al. | 438/53 |
| 6,311,561 B1 | 11/2001 | Bang et al. | 73/708 |
| 6,313,529 B1 | 11/2001 | Yoshihara et al. | |
| 6,346,742 B1 | 2/2002 | Bryzek et al. | 257/704 |
| 6,351,390 B1 | 2/2002 | Mayer et al. | |
| 6,351,996 B1 | 3/2002 | Nasiri et al. | 73/706 |
| 6,405,597 B1 | 6/2002 | Brouwer et al. | 73/754 |
| 6,644,125 B1 | 11/2003 | Siess et al. | 73/754 |
| 6,732,588 B1 | 5/2004 | Mullenborn et al. | |
| 6,844,606 B2* | 1/2005 | Logsdon et al. | 257/434 |
| 6,927,482 B1 | 8/2005 | Kim et al. | |
| 7,141,869 B2* | 11/2006 | Kim et al. | 257/673 |
| 7,150,195 B2* | 12/2006 | Jacobsen et al. | 73/715 |
| 7,384,818 B2* | 6/2008 | Kim et al. | 438/108 |
| 2004/0259325 A1 | 12/2004 | Gan | |

(Continued)

FOREIGN PATENT DOCUMENTS

DE    19902450 A1    8/2000

OTHER PUBLICATIONS

DE 19902450A1 english machine translation.*

(Continued)

*Primary Examiner*—Jessica L Ward
*Assistant Examiner*—Erin B Saad
(74) *Attorney, Agent, or Firm*—Matthew Smyth

(57) ABSTRACT

A method of forming a sensor for sensing a physical property of a media. A substrate is provided having circuitry thereon including at least one electrical contact and a die is provided having disposed thereon corresponding electrical contacts and a sensing element for sensing a physical property of a media applied to said sensing element. One or more bonding ring or portions are arranged on the die. The die electrical contact(s) and bonding ring(s) can be bonded substantially simultaneously, with conductive bonding material, to the corresponding substrate electrical contact(s) and a surface of said substrate, respectively, to thereby form a sensor. The bonding ring(s) form a pressure seal. The substrate can include corresponding bonding ring(s). The die can include an ASIC for compensating temperature effects on said pressure sensor.

20 Claims, 10 Drawing Sheets

U.S. PATENT DOCUMENTS

2005/0205951 A1 9/2005 Eskridge .................... 257/416
2008/0237826 A1* 10/2008 Funk ......................... 257/686

OTHER PUBLICATIONS

Xiao, Guo-wei, Chan, Philip C.H., Teng, Annette, Cai, Jian, Yeun Matthew M.F., *A Pressure Sensor Using Flip-Chip on Low-Cost Flexible Substrate*, Hong Kong University of Science and Technology.

Tadigadapa, S, Massoud-Ansari, Sonbol, *Applications of High-Performance MEMS Pressure Sensors Based on Dissolved Wafer Process*, Integrated Sensing Systems Inc.

Pan, L.W., Yuen, P., Lin, L., Garcia E.J., *Flip Chip Electrical Interconnection by Selective Electroplating and Bonding*, Microsystem Technologies, 2003, pp. 7-10.

* cited by examiner

METHOD OF FLIP CHIP MOUNTING PRESSURE SENSOR DIES TO SUBSTRATES AND PRESSURE SENSORS FORMED THEREBY

TECHNICAL FIELD

Embodiments are generally related to sensors, and in particular, to methods of manufacturing sensors. Embodiments are additionally related to methods of flip chip mounting sensor transducers, such as pressure transducers, to a substrate and sensors formed thereby. Also, embodiments are related to calibrating such sensors to compensate for temperature effects on the sensors.

BACKGROUND OF THE INVENTION

Typical pressure sensors are not particularly well suited to low cost applications by virtue of the relatively high number of component parts, expensive materials and/or processing requirements, and high number of manufacturing-processing steps required to both produce the sensors and to integrate them into the instrumentation or apparatus of the application.

In order to manufacture a typical pressure sensor, it is usually necessary to make electrical connections between the sensor components and associated circuitry and to establish a pressure seal interface between the circuitry and a pressure media which is to be applied to the sensor. Generally, making the electrical connections and forming the pressure seal interface require at least two independent process steps during production. Even more process steps are required when sealing both sides of the sensor. This results in increased cost.

There is a continuing need to provide pressure sensors which can be manufactured more efficiently and/or at lower cost.

The embodiments disclosed herein therefore directly address the shortcomings of methods of manufacturing present pressure sensors providing a low cost method of manufacturing a pressure sensor that is suitable for many price sensitive applications.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect to provide an improved method of attaching a sensor die to a substrate.

It is another aspect, to provide for a method of manufacturing a flip-chip mounted pressure sensor.

It is another aspect to provide a low cost flip-chip mounted pressure sensor.

It is a further aspect of the present invention to provide a flip-chip mounted pressure sensor having improved temperature compensation and accuracy.

The aforementioned aspects of the invention and other objectives and advantages can now be achieved as described herein. Methods of attaching sensor dies to substrates to form sensors are disclosed.

According to one aspect, there is provided a substrate having circuitry thereon including at least one electrical contact. Also provided is a sensor die having disposed thereon a sensing element for sensing a physical property, such as pressure, of a media applied to the sensing element, and circuitry including at least one electrical contact for electrically connecting the die circuitry to the substrate circuitry. One or more bonding areas are arranged on the sensor die surface and the substrate surface. The die electrical contact(s) and die bonding area(s) are bonded on corresponding substrate electrical contact(s) and substrate bonding area(s), respectively, substantially simultaneously, with conductive bonding material. Bonding the substrate bonding area(s) on the die bonding area(s) forms a pressure seal for isolating the electrical contacts from the media applied to the die By using conductive bonding material to bond substantially simultaneously the sensor die bonding area(s) and die electrical contacts to the substrate bonding area(s) and substrate electrical contacts, respectively, electrical connection between the sensor die and substrate circuitry and formation of the pressure seal interfaces can be effected in one simple step so that the sensor assembly is simplified to just one component.

The conductive bonding material can be solder, conductive epoxy or other conductive adhesive material.

The sensor die bonding area(s) can be bonded directly to the substrate bonding area(s) using the conductive bonding material.

Alternatively, at least one bonding ring or portion can be formed on the substrate bonding surface area and/or sensor die bonding area. The sensor die bonding ring(s) or area(s) can be aligned with the corresponding substrate bonding ring(s) or area(s) and bonded together using the conductive material. Each bonding ring can be in the form of a metalized ring, such as a solder ring.

Preferably, at least one bonding ring or portion is formed on the sensor die bonding area and a corresponding bonding ring or portion is formed on the substrate bonding area. Thereafter, the sensor die bonding ring(s) can be bonded to the substrate bonding ring(s) and the sensor die electrical contact(s) can be bonded to the substrate electrical contacts substantially simultaneously, with conductive bonding material.

An Application Specific Integrated Circuit (ASIC) chip can be mounted with the sensor die for calibrating the pressure sensor output to compensate for temperature effects on the pressure sensor. The ASIC can be independently embedded in, or mounted on, the substrate. A separate die or preferably the ASIC can be embedded in or mounted on the same die as the sensor.

The bonding ring(s) on the sensor die can be arranged whereby the bonded sensor die and corresponding substrate bonding ring(s) form the pressure seal for isolating the electrical contacts and the ASIC from the pressure media. When the ASIC is mounted in or on the sensor die or as separate die, the sensor die electrical contact(s), the ASIC, and the bonding ring(s) can be respectively bonded to the substrate electrical contact(s), substrate circuitry and corresponding bonding ring(s) substantially simultaneously with conductive bonding material.

By using conductive bonding material to bond substantially simultaneously the sensor die bonding ring, electrical contacts and ASIC to the substrate, the electrical contacts, pressure seal interfaces, and ASIC connection can be affected in one simple step so that the sensor assembly is simplified to just one component.

Furthermore, since a single sensor die contains both the sensing element and ASIC circuitry, the bonding rings can be placed around the sensing element and the outside edge of the package allowing complete isolation between the media and the electronic circuit. This package could take advantage of a wide variety of output signals that are already available, such as amplified analog output or digital outputs including I2, SPI, and OWI.

By providing this flip chip die mount capability for the ASIC itself, improved temperature performance may be obtained. Also, having the ASIC, sense die and media at relatively the same temperature, during testing and in the end application, the pressure compensation and the temperature output accuracy can be improved.

According to another aspect, a method of manufacturing a pressure sensor comprises, forming a sensing element on a die for sensing a pressure media applied to the front and/or rear side of the die, forming at least one electrical contact disposed on the front side of the die, mounting an ASIC chip to the front side of die, the ASIC being adapted to receive an output of the pressure sensor and being programmable to calibrate the output to compensate for temperature effects on the pressure sensor, forming at least one bonding ring or portion on a bonding surface area of the front side of the die, forming circuitry on a substrate, the circuitry including corresponding electrical contact(s) and ASIC receiving circuitry, forming at least one corresponding bonding ring or portion on a bonding surface area of the substrate, and bonding substantially simultaneously, with conductive bonding material, the die electrical contact(s), the ASIC, and the die bonding ring(s) to the substrate electrical contact(s), the ASIC receiving circuitry and the substrate bonding ring(s), respectively, thereby forming the pressure sensor, whereby bonding the die bonding ring(s) to the corresponding substrate bonding ring(s) form a pressure seal for isolating the electrical contact(s) and the ASIC from the pressure media applied to the die.

According to yet another aspect, a flip-chip mounted pressure sensor comprises a die having a sensing element for sensing a pressure media applied to the front and/or rear side of the die at least one electrical contact disposed on the front side of the die, at least one bonding area on the front side of the die, a substrate having circuitry, including corresponding electrical contacts and corresponding bonding areas thereon, and wherein the die electrical contact(s) and the die bonding area(s) are bonded to the substrate electrical contact(s) and the substrate bonding area(s), respectively, with conductive material substantially simultaneously, such that bonding between the die bonding area(s) and the substrate bonding area(s) form(s) a pressure seal for isolating the electrical contact(s) from the pressure media applied to the die.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

Figure 1:
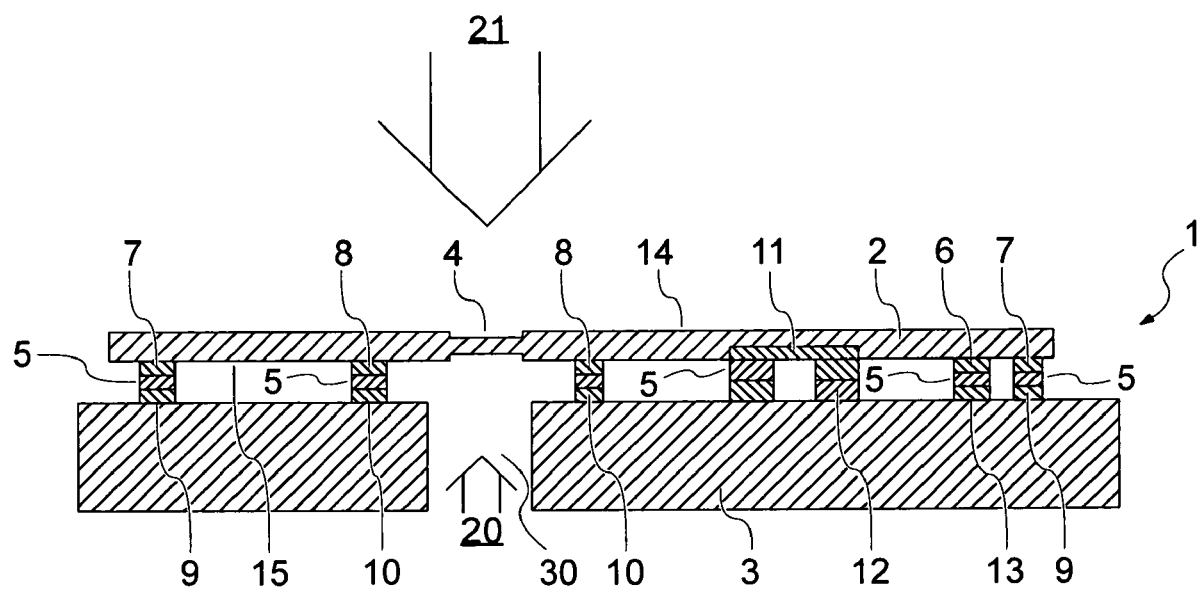
FIG. 1 illustrates a cross-sectional view of a pressure sensor formed by flip-chip mounting a die to a substrate according to a preferred embodiment.
Figure 2:
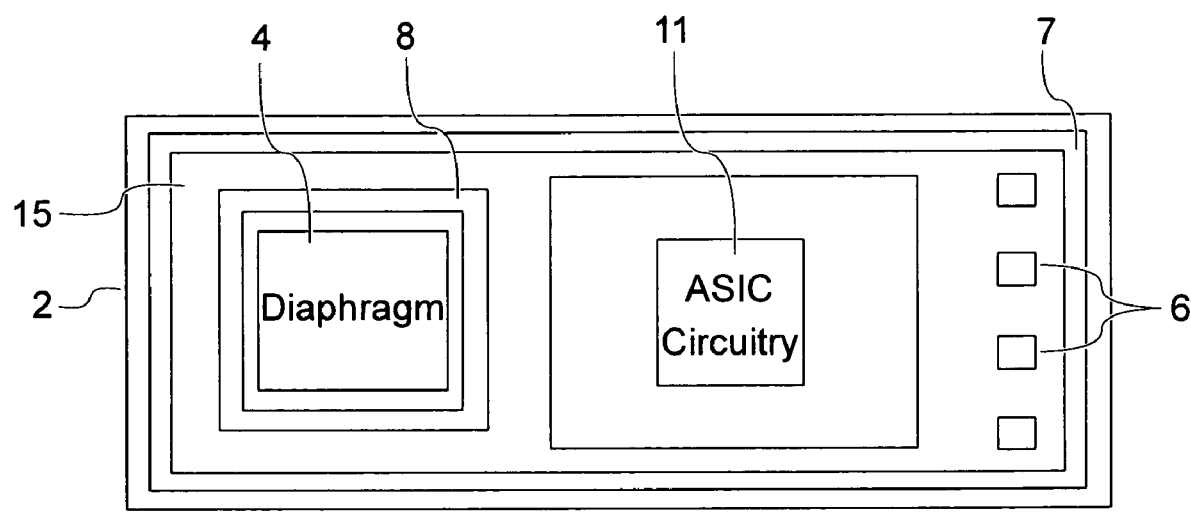
FIG. 2 illustrates a plan view of the front side of the die shown in FIG. 1.

Referring to FIGS. 1 & 2 of the accompanying drawings, which respectively, illustrate a cross-sectional view of a pressure sensor 1 formed by flip-chip mounting a die on a substrate and a plan view of the front side of the die shown in FIG. 1 according to one embodiment, the pressure sensor 1 has a sensor die 2 including a front side 15 and a rear side 14 for receiving fluids 20, 21, respectively, and a sensing element 4 supported on the sensor die 2 for sensing a physical property of the fluids 20, 21. A plurality of electrical contacts 6 in the form of solder pads for electrical connection to corresponding electrical contacts 13 on the substrate are disposed on the front side 15 and electrically coupled to circuitry (not shown) associated with the sensing element. Also disposed on the front side 15 is an embedded ASIC chip 11 for calibrating the pressure outputs and compensating temperature effects on the pressure sensor output created by temperature coefficient mismatches between the die and substrate as will be described in more detail below. Alternatively, the ASIC can be embedded directly on the substrate ASIC receiving circuitry. Also, the electrical contacts 6, 13 can be laid out symmetrically if a more even distribution of the stress produced during assembly is required.

In the example shown in FIG. 1, the sensor die 2 is formed from silicon and the sensing element 4 is in the form of a diaphragm which is arranged in the die such that a change in pressure of a pressure media, such as fluid 20 or fluid 21, applied to the front or rear side of the die causes a corresponding change in the deflection of the diaphragm. Those skilled in the art would understand that the illustration of FIG. 1 is merely depicting one example of the embodiments and that the embodiments are not limited thereto. A person skilled in the art would know that other types of dies other than silicon dies could be utilized and that other types of sensing elements for sensing pressure other than diaphragms could be used. Furthermore, a skilled person would understand that sensing elements for detection of other types of physical properties of the fluid, such as temperature or electrical conductivity, could equally be used.

Those skilled in the art would also understand that the diaphragm 4 shown in the example of FIG. 1 can form part of various types of sensor systems which are capable of converting the diaphragm deflection into an electrical signal for further processing to determine the pressure differential applied to the diaphragm.

In the example of FIG. 1, silicon resistors (not shown) are implanted in the diaphragm area 4 of the silicon. The silicon is then etched to thin the diaphragm area so that the diaphragm can flex in response to an applied pressure causing a corresponding change in resistance of the silicon resistors. Implantation of the silicon resistors and etching of the diaphragm can be performed by means of standard semiconductor fabrication techniques known in the art. Sensors having different pressure sensitivities can be manufactured by controlling the diaphragm thickness. The thinner the diaphragm, the more sensitive the sensor to lower pressures. The change in resistance is detected by means of processing circuitry which circuitry provides a signal corresponding to the applied pressure. The processing circuitry can be integrated in the sensor die itself or can be located remotely and connected to the sensing element via circuitry on the substrate. In the example of FIG. 1, the ASIC 11 forms the processing circuitry.

As best shown in FIG. 2, an inner bonding ring or trace 8 formed on a bonding surface area of the front side 15 of the die 2 surrounds the sensing element 4. The ASIC circuitry and plurality of electrical contacts 6 are located in an area of the front side 15 outside the inner bonding ring 8 or trace surrounding the sensing element 4 (sensor diaphragm 4 of FIG. 1). The ASIC is embedded in the same silicon die as in which the diaphragm is formed. Also surface formed on a bonding surface area on the front side 15, at the periphery thereof, is an outer bonding ring 7 or trace surrounding the, inner bonding ring 8, the ASIC circuitry 11 and plurality of contacts 6.

Figure 3:
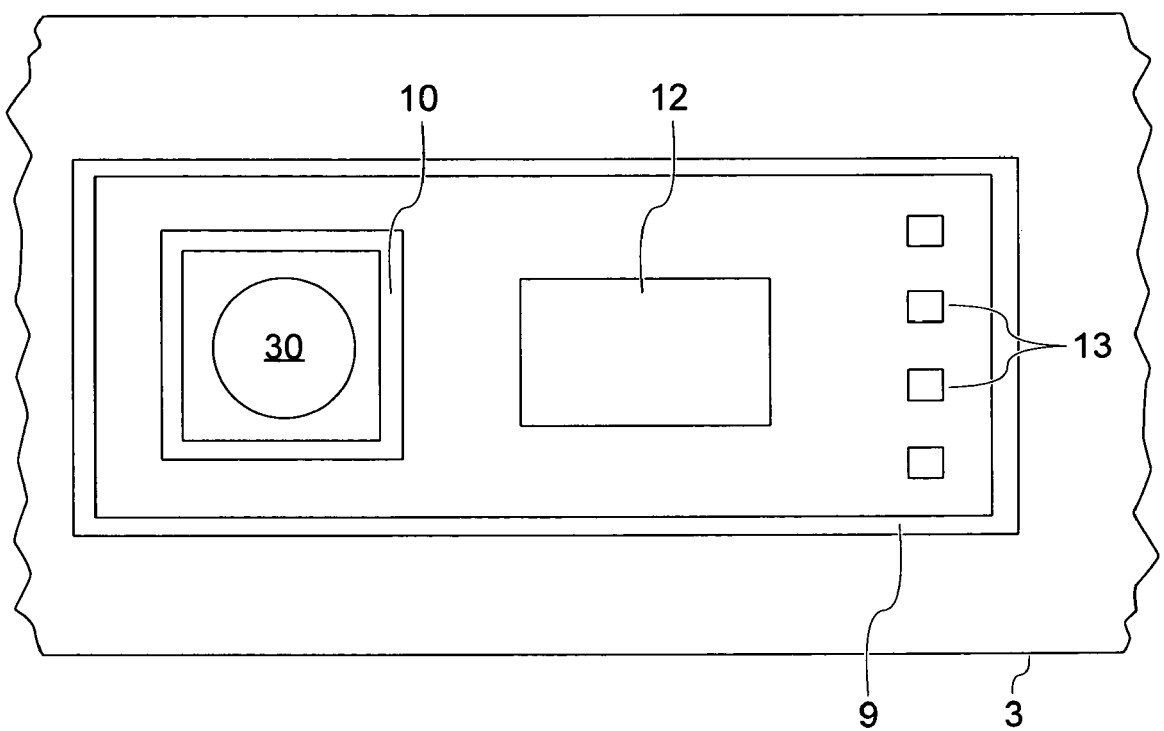
FIG. 3 illustrates a plan view of the substrate shown in FIG. 1.

As shown in FIG. 3, which illustrates a plan view of the substrate layout prepared for accepting the sensor die 2 including the ASIC chip, corresponding electrical contacts 13, ASIC receiving circuitry area 12, and inner and outer bonding rings 10, 9 are formed on the substrate for respectively receiving the ASIC circuitry 11, electrical contacts 6 and inner and outer bonding rings 8, 7. In the example of FIG. 1, the substrate comprises a printed circuit board (PCB) compatible with the media to be used and having an aperture 30 therein for allowing application of the media, i.e. fluid 20, to the front side of the die and sensing element 4. Substrate 3 can, however, be any type of structure which is adapted to receive and carry the die or chip 2.

As shown in FIG. 1, the outer bonding rings 7,9 are arranged such that, when bonded together with conductive bonding 5, the outer bonding rings form a pressure seal interface between the fluid 21 applied to the rear side 14 of the sensor die 2 and the electrical circuitry, including the ASIC circuitry 11 and plurality of electrical contacts 6 on the front side 15 and the plurality of electrical contacts 9 and ASIC receiving circuitry 12 on the substrate, thereby isolating the sensor circuitry from the fluid 21. The inner bonding rings 8, 9 are arranged such that, when bonded together with the conductive bonding 5, the inner rings from a pressure seal interface between the fluid 20 applied to the front side 15 of the sensor die via aperture 30 and the sensor electrical circuitry 6,9,11,12 thereby isolating the sensor die circuitry from the fluid 21. In addition to serving as pressure seal interfaces, the bonded outer and inner bonding rings also function as mechanical connections securing the sensor die to the substrate and facilitate self-alignment of the sensor die on the substrate.

The inner bonding rings 8, 10 may be omitted from the substrate 3 and sensor die 2 and only the outer rings utilized for attachment and pressure sealing in applications in which isolation of the sensor die circuitry 6,9,11,12 from the media applied to the front side 15 is not required. Alternatively, the outer bonding rings 7, 9 may be omitted from the sensor die 2 and substrate 3 and only the inner rings 8, 10 utilized for attachment and pressure sealing in applications in which isolation of the sensor die circuitry 6, 9, 11, 12 from the media applied to the rear side 14 is not required.

In the example of FIG. 1, the inner bonding rings 8, 10 are square in shape and the outer bonding rings 7, 9 are rectangular in shape, however, many different shapes and forms of rings or trace can be adopted. All that is required is that the inner and outer bonding rings form the appropriate pressure seal when bonded together. Furthermore, in the example of FIG. 1 the inner and outer bonding rings are in the form of metallization or solder rings so that the corresponding rings can be soldered together using solder as the conductive material 5 by soldering processes utilized in standard flip chip fabrication technology as will be explained in more detail below.

A method of attaching the sensor die 2 to the substrate 3 by means of a flip-chip process to form a fully functional sensor will now be described with reference to FIGS. 1 to 3. Initially, the inner and outer bonding rings 8, 7, plurality of electrical contacts 6, and ASIC chip 11 on the sensor die 2 are prepared for attachment to the corresponding inner and outer bonding rings 10, 9, plurality of electrical contacts 9 and ASIC receiving circuitry 12 of the substrate 3 by bumping the die according to known flip-chip techniques, such as solder bumping or plated bumping. The sensor die 2 is then flipped over with its front side 15 facing the substrate 3. The inner and outer bonding rings, electrical contacts and ASIC of the die are respectively aligned with the inner and outer bonding rings, electrical contacts and ASIC receiving circuitry of the substrate and then attached to one another substantially simultaneously by means of a soldering process.

By bonding substantially simultaneously the inner and outer bonding rings 8, 10, 7, 9, the electrical contacts 6, 13, and ASIC 11 and receiving circuitry 11 with conductive material 5, both the electrical connections between the sensor die including the ASIC and the substrate and the pressure seal interfaces can be effected in one simple step so that the sensor assembly is simplified to just one component. Furthermore, since a single sensor die contains both the sensing element 4 and ASIC 11 circuitry, the solder rings can be placed around the diaphragm and the outside edge of the package allowing complete isolation between the media and the electronic circuit. This package could take advantage of a wide variety of output signals that are already available, such as amplified analog output or digital outputs including I2C, SPI, and OWI. Any output that could be designed into the desired ASIC area of the sensor die could be obtained.

By providing this flip chip die mount capability for the ASIC itself, improved temperature performance may be obtained. Also, by having the ASIC, sense die and media at relatively the same temperature the pressure compensation and the temperature output accuracy can be improved.

The temperature coefficient mismatch between the sensor die and the substrate may cause additional stress over temperature by virtue of the fact that the sensor die is rigidly connected to the substrate. In order to relieve stresses generated by the assembly operation and stabilize the solder joints, the components are thermally cycled or temperature shocked by known means so that the stress is repeatable over temperature enabling the ASIC to be used to calibrate the sensor output to compensate for these temperature dependent effects. Thermally cycling is completed preparatory to any calibration that is to be performed so as to allow any output shifts caused by the stress relief to occur prior to permanently setting the sensor output.

Temperatures may be chosen at the maximum extremes allowable without causing damage or reduce product life. At or above normal storage temperature is preferred. Other stress relieving options may also be chosen if they are more appropriate, such as a bake at only hot temperature.

The pressure sensor assembly calibration process consists of collecting data from the ASIC at various temperatures and pressures. Computer hardware electrically coupled to the substrate operates test software which is used to digitally communicate with each ASIC for retrieving sense die and temperature responses as the stimuli are controlled. A typical calibration process consists of testing at three temperatures and three pressures at each temperature. The sense die's pressure and temperature data are read through the ASIC at each of the nine controlled pressure points (three at each of the three temperatures).

Once this data is collected, it is placed into curve fitting software to determine the best coefficients required to properly program the ASIC to perform to the desired output. An ASIC continuously runs a through a loop that accumulates the latest pressure and temperature internally and places the values into an equation that determines the final output of the sensor assembly. By programming this equation into the curve fitting software and knowing the actual sensor assembly performance over the three temperatures and three pressures at each temperature the best coefficients can be provided by the software. These coefficients are then programmed into the ASIC and stored permanently in the resident EEPROM. If tighter accuracy is required, additional pressures and/or temperatures may be used to provide additional information to the curve fitting software. This additional information will then allow the curve fitting software to produce a better fit for the solution. If less accuracy is required only two temperatures may be required. Once the typical sense die performance is determined the third temperature point can be extrapolated with a regression formula. Other types of ASICs can also be used. For examples another ASIC technology stores the curve fit results as a look up table in the EEPROM. The data collection and resulting compensation is similar.

Assembly of the sensor die to the substrate in a single fabrication step to form the sensor and subsequent thermal cycling can produce a very low cost assembly solution. The remainder of the cost of the sensor then can be determined by the calibration process required to produce the desired accuracy.

There are several methods for providing the temperature and pressure stimuli that may be selected. The most common solution would be to fixture the pressure sensor assemblies in batch form place them in a temperature chamber and provide the pressure source with a calibrated pressure controller. Test software would be written to control the chamber and the controller as well as reading the pressure sensors under test.

In order to reduce the time factor, and other problems related to batch testing, another alternative is to use a forced air solution to rapidly change the temperature of the device under test. This approach changes a cycle time from hours to minutes, although fewer parts are tested at a time.

By using the aforementioned forced air solution with a proportional air valve to control the pressure and an accurate pressure indicator and time can be reduced even farther without sacrificing accuracy.

Another advantage to keeping the package size small is that time to temperature of the forced air system is mainly restricted by the mass of the devices to be tested. By using this flip chip approach and keeping the package size smaller the time to temperature can greatly improve. Consequently, by increasing calibration speed and requiring less capital investment, the cost of manufacturing the flip chip pressure sensor can be yet further reduced.

Figure 4:
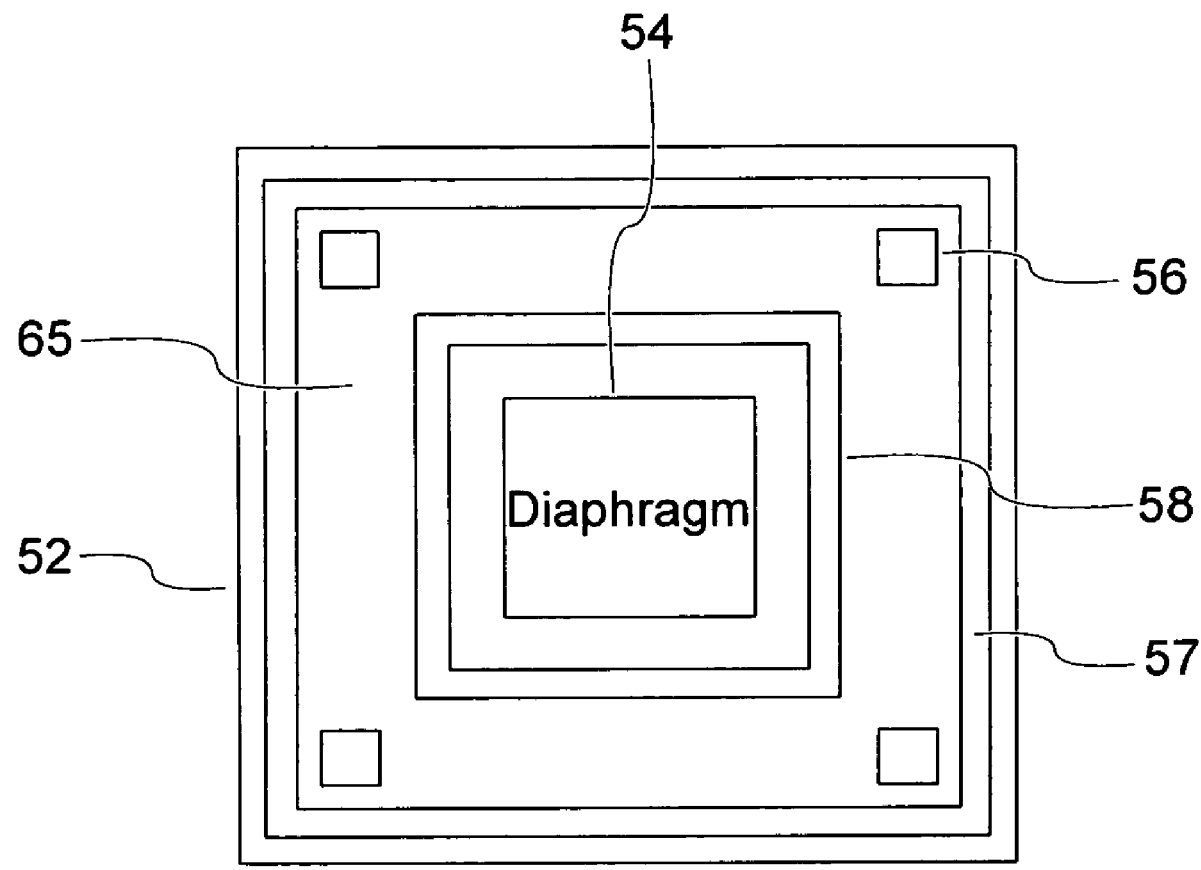
FIGS. 4 and 5 respectively illustrate plan views of a sensor die and substrate according to another embodiment.
Figure 5:
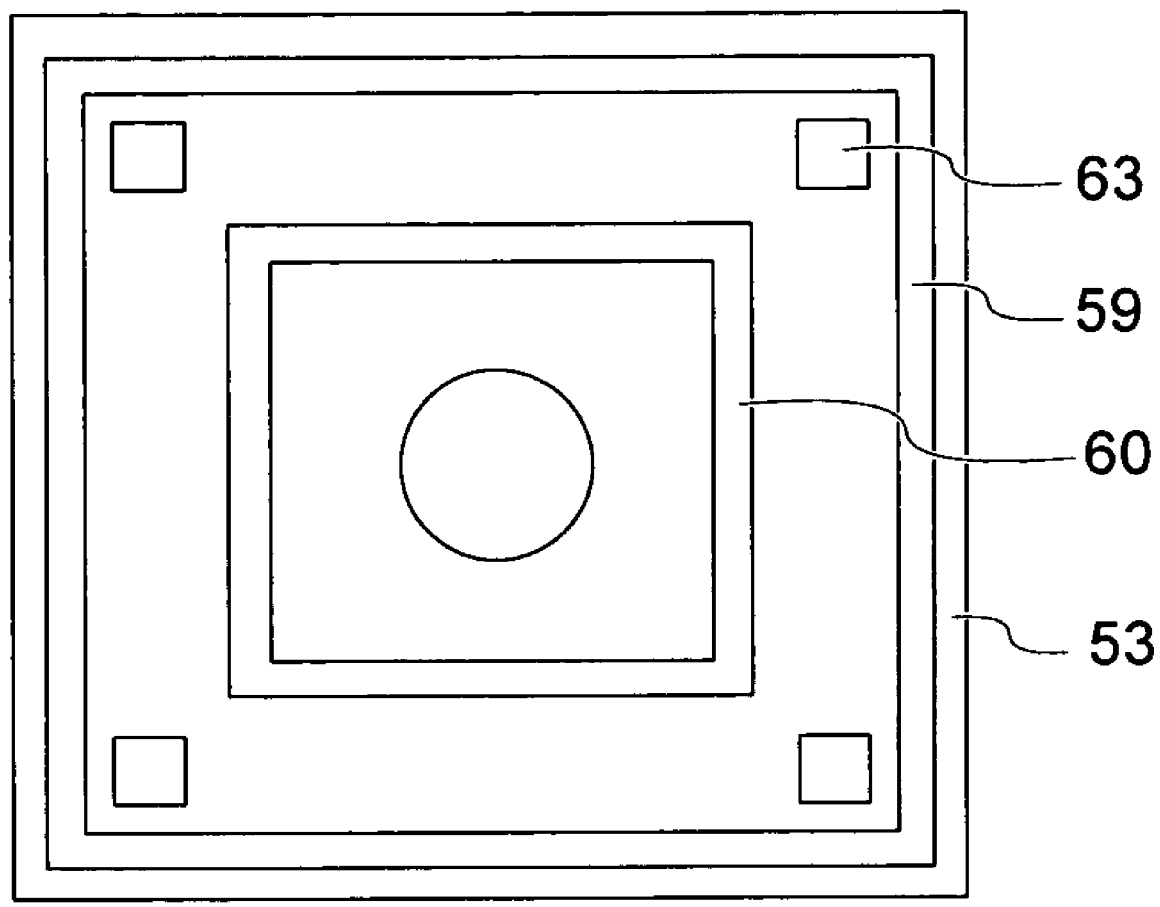
Figure 6:
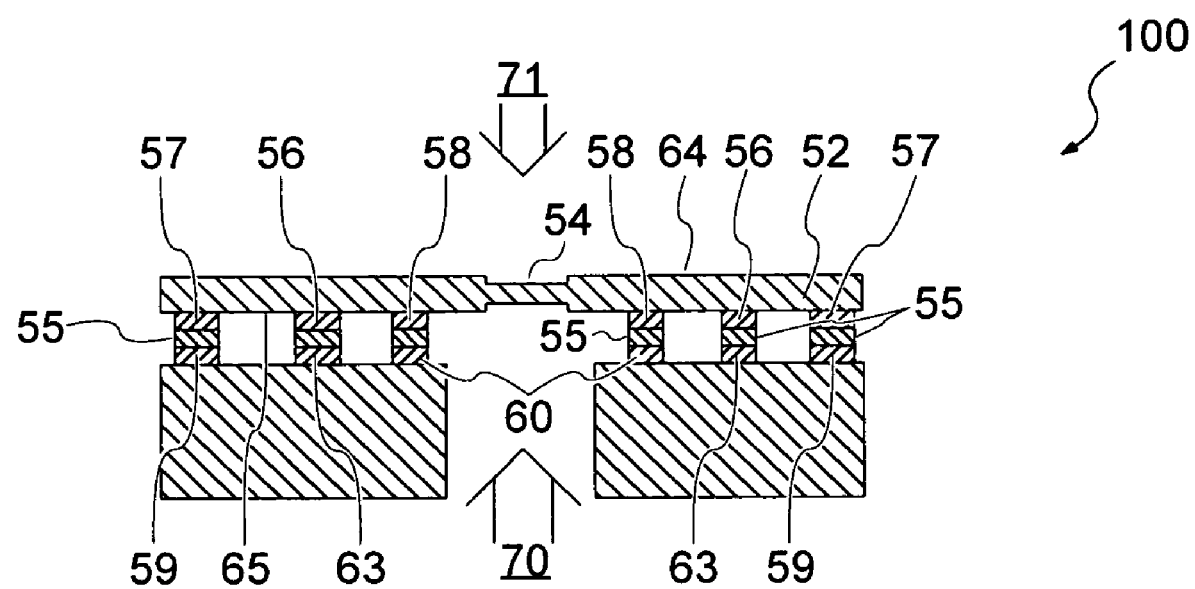
FIG. 6 illustrates a cross-sectional view of the sensor die flip chip mounted to a substrate according to another embodiment.

FIGS. 4 & 5, respectively illustrate plan views of the front side of a sensor die and substrate according to another embodiment, and FIG. 6 illustrates a cross-sectional view of a pressure sensor 100 formed by flip-chip mounting a die on a substrate according to another embodiment. The sensor die 52 and substrate 52 are similar to the sensor die 2 and substrate 3 of the first embodiment save that an ASIC chip is not included on the sensor die 52. The sensor die 52 therefore has a front side 65 for receiving fluid 70, a rear side 64 for receiving fluid 71 and a sensing element 54 supported thereon for sensing a physical property of the fluids applied to the front and rear sides 65, 64, respectively. A plurality of electrical contacts 56 in the form of solder pads for electrical connection to corresponding electrical contacts 63 on the substrate 53 are disposed on the front side 65 and electrically coupled to circuitry (not shown) associated with the sensing element. Inner bonding ring 58 surrounds the diaphragm 54 and is arranged to be bonded to a corresponding bonding ring 59 on the substrate 53 such that the pressure seal interface is formed between the electrical contacts 56 on the sensor die and the pressure media 70 applied to the front side 65 of the sensor die. Outer bonding ring 57 surrounds the electrical contacts 56 and the inner bonding ring 58 and is arranged to be bonded to a corresponding outer bonding ring 59 on the substrate such that the pressure seal interface is formed between the electrical contacts 56,63 and the pressure media 71 applied to the rear side 64 of the sensor die. The sensor die 52 and substrate 53 are bonded together using conductive bonding material 85 in the same manner as the sensor die 2 and substrate 3 of the first embodiment shown in FIG. 1 are bonded together.

As in the case of the first embodiment, inner bonding rings 58, 60 can be omitted when isolation from the pressure media applied to the front side 65 of the sensor die 52 is not required. Alternatively, outer bonding rings 56, 59 can be omitted when isolation from the pressure media applied to the rear side 64 of the sensor die is not required. The shape and form of the bonding rings, the type of bonding materials used and the method of attaching the sensor die to the substrate is the same as in the first embodiment with exception that the ASIC chip and the associated calibration process is not used.

Figure 7:
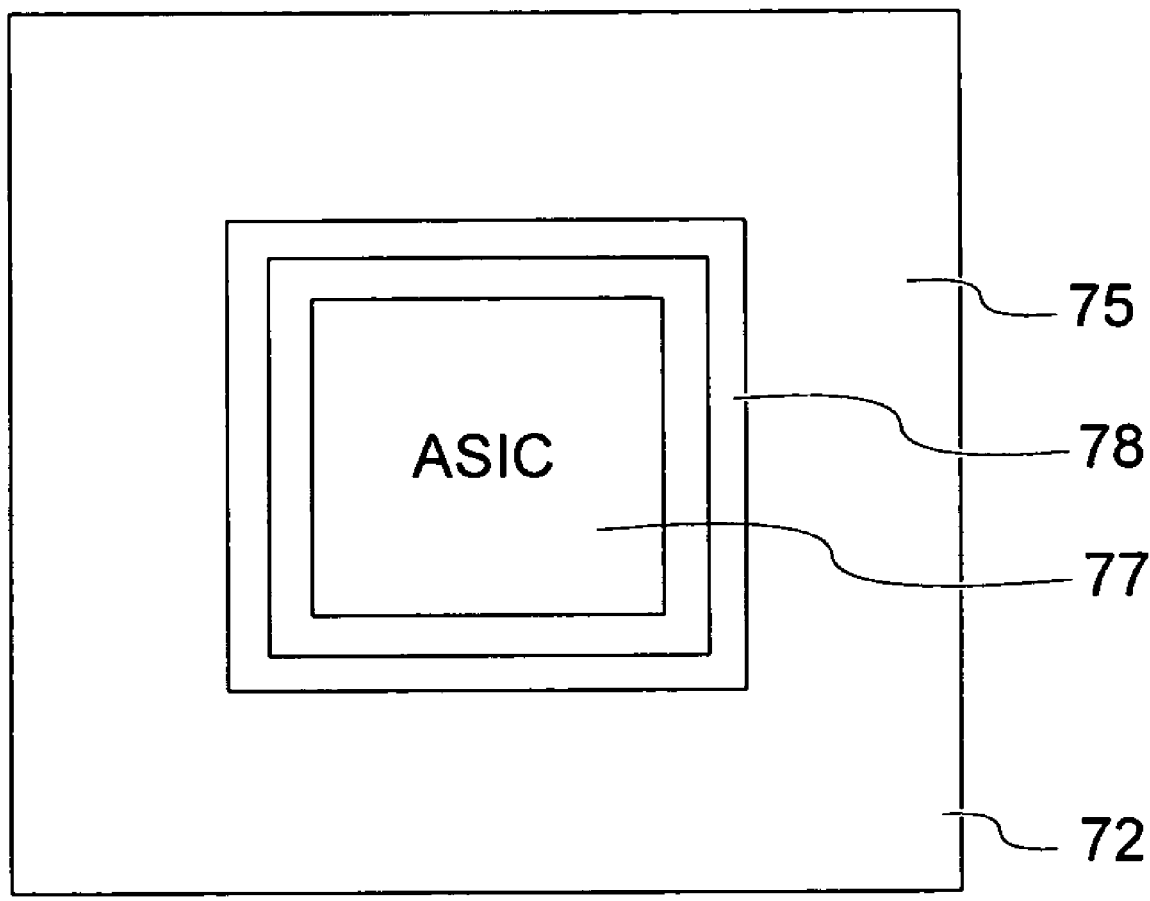
FIG. 7 illustrates a plan view of an ASIC formed on a separate die.
Figure 8:
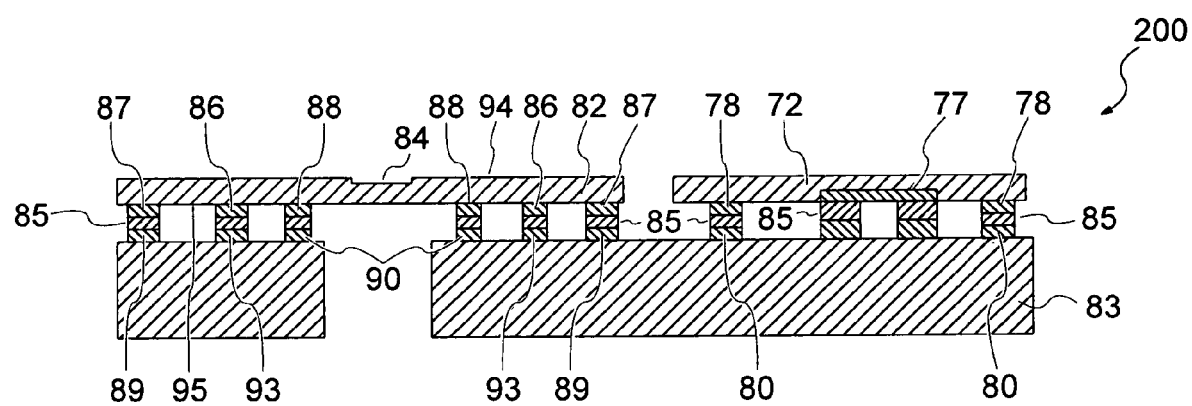
FIG. 8 illustrates a cross-sectional view of pressure sensor formed by flip-chip mounting a sensor die and the ASIC die of FIG. 7 on a substrate according to yet another embodiment.

Referring to FIG. 8, which illustrates a cross-sectional view of a pressure sensor formed by flip-chip mounting separate sensor and ASIC dies to a substrate according to yet another embodiment, the pressure sensor 200 has a sensor die 82 similar in arrangement to the sensor die 52 of the embodiment of FIG. 6. The sensor die 82 therefore has a front side 95, a rear side 94, a sensing element 84, a plurality of electrical contacts 86 for electrical connection to corresponding contacts 93 formed on the substrate 83, and inner and outer bonding rings 88, 87 for bonding to corresponding bonding rings 90, 89 formed on the substrate. The substrate 83 differs from substrate 53 of FIG. 6 in that the substrate 83 is designed to receive a separate die 72 having an ASIC 77 embedded in the front side 75 of the die 72. A plan view of the ASIC die 72 is shown in FIG. 7. A bonding ring 78 can be formed on a bonding surface area on the front side 75 surrounding the ASIC for bonding to a corresponding bonding ring 80 on the substrate 83 so as to form a pressure seal isolating the ASIC 77 from a pressure media applied to the front side 74 of the die 72.

Providing the ASIC and sensing elements on separate dies enables more flexibility insofar as component placement and substrate design. The sensor die electrical contacts 86 and the sensor die and ASIC bonding rings 88,87,78 can still be simultaneously bonded to the corresponding electrical contacts 93 and bonding rings 90, 89, 80 using conductive material.

Figure 9:
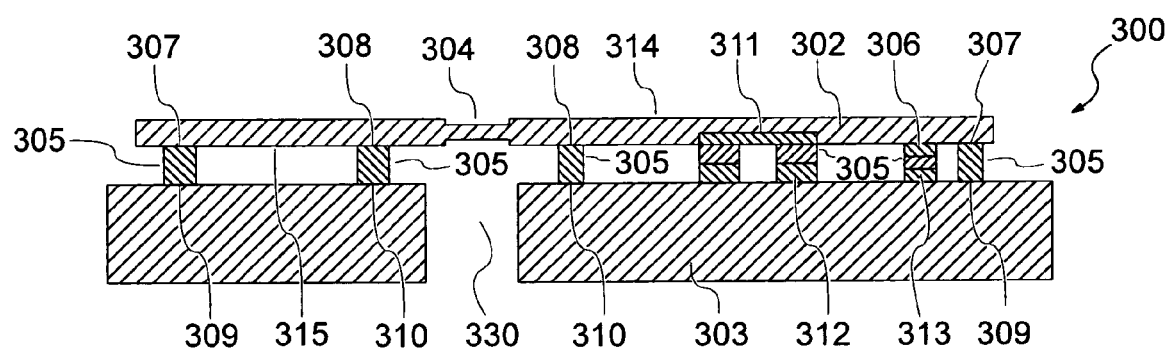
FIG. 9 illustrates a cross-sectional view of a pressure sensor formed by flip-chip mounting a sensor die to a substrate according to yet another embodiment.
Figure 10:
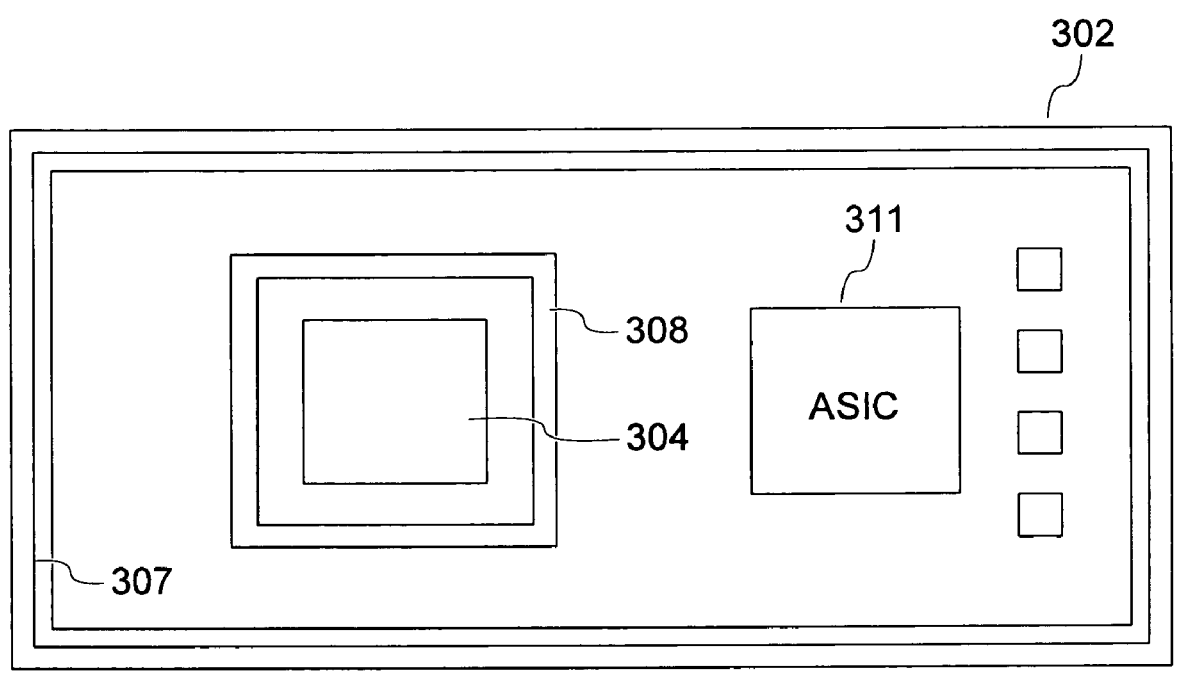
FIG. 10 illustrates a plan view of the front side of the sensor die of FIG. 9.

In yet another embodiment, the pressure sensor is flip-chip bonded to the substrate using conductive epoxy or other like conductive adhesive. As shown in FIGS. 9 & 10, which illustrate a cross-sectional view of a pressure sensor 300 formed by flip chip bonding a sensor die to a substrate using conductive epoxy and a plan view of the front side of the sensor die, respectively, the pressure sensor 300 has a sensor die 302 and a substrate 303 which are respectively identical to the sensor die 2 and substrate 3 of the first embodiment shown in FIG. 1 save that the bonding rings are omitted from the sensor die and substrate leaving bonding surface areas of the sensor die and substrate for bonding to one another directly. The sensor die bonding surface areas, defined in the shape of an inner ring 308 surrounding the sensing element 304 and outer ring 307 surrounding the inner ring 308 and ASIC 311, are attached directly to corresponding bonding areas 310,309 of the substrate surface by means of conductive epoxy 305. The conductive epoxy 305 can also be used to bond the electrical contacts 306 of the sensor die to the electrical contacts 313 of the substrate and to bond the ASIC 311 to the ASIC receiving circuitry 312. The resulting epoxy bonds formed between the bonding surface areas 307,309 and 308,310 form the pressure seal for isolating the electrical contacts 306,313 and ASIC 11 from the pressure media applied to the front side 315 or rear side 314 of the sensor die 302.

Conductive epoxy 305 or other like conductive adhesive can therefore be used during the flip chip process for bonding substantially simultaneously the die electrical contacts 306, ASIC 311 and bonding surface areas 307,308, to the substrate electrical contacts 313, ASIC receiving circuitry 12 and bonding surface areas 309, 310 of the substrate 303, respectively.

Bonding between the outer bonding surfaces 309, 307 can be omitted in cases in which isolation from a pressure media applied to the rear side 314 is not required and bonding between the inner bonding surfaces 308, 310 can be omitted in cases in which isolation from a pressure media applied to the front side 315 of the die 302 is not required. Also, the ASIC can be placed on the substrate 303 rather than embedded in the sensor die 302, or alternatively, embedded in a separate die having a bonding surface area surrounding the ASIC for bonding to a corresponding bonding surface on the substrate using the conductive epoxy.

In yet further embodiments, pressure sensors can be arranged for example as shown in the embodiments of FIGS. 6 or 8 but with the bonding rings omitted and the bonding areas of the die(s) and substrate bonded directly to one another with conductive epoxy to form the appropriate pressure seals.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered.

For example the skilled person would understand that bonding rings could be omitted from the substrate and that the die bonding rings could be bonding directly to the surface of the substrate to form the pressure seal interfaces if need be.

The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

What is claimed is:

1. A method of attaching a sensing die to a substrate comprising:

forming substrate circuitry on said substrate, said substrate circuitry including at least one electrical contact;

forming a sensing element on said sensing die for sensing a physical property of a media applied to said sensing element, and sensing die circuitry including at least one electrical contact for electrically connecting said sensing die circuitry to said substrate circuitry;

defining at least one bonding area on the surface of said sensing die;

defining at least one corresponding bonding area on the surface of said substrate;

providing an ASIC on or in said sensing die or said substrate, said ASIC being programmable to calibrate an output of said sensing element to compensate for temperature effects of said sensing element;

bonding substantially simultaneously, with conductive bonding material, said sensing die electrical contact(s) and said sensing die bonding area(s) to said corresponding substrate electrical contact(s) and said substrate bonding area(s), respectively, to thereby form a sensor; and arranging said sensing die bonding area(s), whereby, bonding said sensing die bonding area(s) to said substrate bonding area(s) forms a pressure seal for isolating said electrical contacts and said ASIC from said media applied to said sensing die.

2. The method of claim 1, wherein bonding said sensing die bonding area(s) to said substrate bonding area(s) comprises bonding said sensing die bonding area(s) directly to said substrate bonding area(s).

3. The method of claim 1, wherein bonding said sensing die bonding area(s) to said substrate bonding area(s) comprises:

arranging at least one bonding ring or portion on said at least one bonding area of said sensing die and/or said substrate; and bonding said bonding ring(s) of said substrate and/or said sensing die to corresponding bonding ring(s) or bonding area(s) of said sensing die and/or said substrate.

4. The method of claim 3, wherein bonding said sensing die bonding area(s) to said corresponding substrate bonding area(s) further comprises:

arranging at least one bonding ring on said at least one bonding area of said sensing die;

arranging at least one corresponding bonding ring on said at least one bonding area of said substrate for bonding to said sensing die bonding ring(s);

aligning said sensing die bonding ring(s) with said corresponding substrate bonding ring(s), bonding said sensing die bonding ring(s) to corresponding substrate bonding rings; and whereby bonding said sensing die bonding ring(s) to said substrate bonding ring(s) forms said pressure seal.

5. The method of claim 1, wherein providing said ASIC comprises providing said ASIC on or in said sensing die; and further comprising bonding substantially simultaneously, with conductive bonding material, said sensing die electrical contact(s), said ASIC and said sensing die bonding area(s) to said corresponding substrate electrical contact(s), said substrate circuitry and said corresponding substrate bonding area(s), respectively.

6. The method of claim 5, wherein said sensing die electrical contact(s) and said ASIC are disposed on one side of said sensing die, and wherein arranging said sensing die bonding area(s) on said sensing die comprises defining a bonding area surrounding said sensing die electrical contact(s) and said ASIC, whereby, bonding said sensing die bonding area to said corresponding substrate bonding area forms a pressure seal interface between said electrical contact(s) and said media and between said ASIC and said media, said media being applied to an opposite side of said sensing die.

7. The method of claim 5, wherein said sensing die electrical contact(s) and said ASIC are disposed on one side of said sensing die, and wherein arranging said sensing die bonding area on said sensing die comprises defining a bonding area surrounding said sensing element, said sensing die electrical contacts and said ASIC being located on an area of said sensing die outside of said sensing die bonding area, whereby, bonding said sensing die bonding area to said corresponding substrate bonding area forms a pressure seal interface between said electrical contact(s) and said media and between said ASIC and said media, said media being applied to the same side of said sensing die as said sensing die electrical contact(s) and said ASIC.

8. The method of claim 5, wherein said sensing die electrical contact(s) and said ASIC are disposed on one side of said sensing die and wherein arranging said sensing die bonding area(s) on said sensing die comprises:
   forming an inner area surrounding said sensing element, said sensing die electrical contact(s) and said ASIC being located on an area of said sensing die outside of said inner area;
   forming an outer area surrounding said sensing element, said inner bonding area, said sensing die electrical contact(s) and said ASIC;
   whereby bonding said inner and outer areas to corresponding substrate bonding areas forms a pressure seal interface between said sensing electrical contact(s) and said media and between said ASIC and said media, said media being applied to both sides of said sensing die.

9. The method of claim 1, further comprising:
   providing an ASIC on or in one other die, said ASIC being programmable to calibrate the output of said sensing element to compensate for temperature effects of said sensing element;
   arranging a bonding area on said one other die;
   arranging a corresponding bonding area on said substrate for bonding to said bonding area on said one other die;
   bonding substantially simultaneously, with conductive bonding material, said sensing die electrical contact(s), said ASIC, and said bonding area(s) of said sensing die and said one other die to said corresponding substrate electrical contact(s), said substrate circuitry and said corresponding substrate bonding area(s), respectively; and
   arranging said bonding area(s), whereby, bonding said bonding areas of said sensing die and said one other die on said substrate bonding areas form a pressure seal for isolating said electrical contacts and said ASIC from said media.

10. A method of manufacturing a pressure sensor comprising:
    forming a sensing element on a sensing die for sensing a pressure media applied to the front and/or rear side of said sensing die;
    forming at least one electrical contact disposed on the front side of said sensing die;
    mounting an ASIC chip to the front side of sensing die, said ASIC chip being configured to receive an output of said pressure sensor and being programmable to calibrate said output to compensate for temperature effects of said pressure sensor;
    forming at least one bonding ring or portion on a bonding surface area of the front side of said sensing die,
    forming circuitry on a substrate, said circuitry including corresponding electrical contact(s) and ASIC receiving circuitry;
    forming at least one corresponding bonding ring or portion on a bonding surface area of said substrate; and
    bonding substantially simultaneously, with conductive bonding material, said sensing die electrical contact(s), said ASIC, and said sensing die bonding ring(s) to said substrate electrical contact(s), said ASIC receiving circuitry and said substrate bonding ring(s), respectively, thereby forming said pressure sensor;
    whereby bonding said sensing die bonding ring(s) to said corresponding substrate bonding ring(s) form a pressure seal for isolating said electrical contact(s) and said ASIC from said pressure media applied to said sensing die.

11. The method of claim 10, wherein forming said at least one bonding ring on said sensing die bonding surface area comprises forming a bonding ring surrounding said sensing element, said sensing die electrical contact(s) and said ASIC, whereby, bonding said sensing die bonding ring to said corresponding substrate bonding ring forms a pressure seal interface between said electrical contact(s) and said pressure media and between said ASIC and said pressure media, said pressure media being applied to the rear side of said sensing die.

12. The method of claim 10, wherein forming said at least one bonding ring on said sensing die bonding surface area comprises forming a bonding ring surrounding said sensing element, said sensing die electrical contact(s) and said ASIC being located on an area of said sensing die outside of said bonding ring of said sensing die, whereby, bonding said sensing die bonding ring to said corresponding substrate bonding ring forms a pressure seal interface between said electrical contact(s) and said pressure media and between said ASIC and said pressure media, said pressure media being applied to the front side of said sensing die.

13. The method of claim 10, wherein forming at least one bonding ring on the bonding surface area of the front side of said sensing die further comprises:
    forming an inner bonding ring on said sensing die surrounding said sensing element, said sensing die electrical contact(s) and said ASIC being located on an area of said sensing die outside of said inner bonding ring; and
    forming an outer bonding ring surrounding said sensing element, said inner bonding ring, said electrical contact(s) and said ASIC;
    whereby, bonding said sensing die inner and outer bonding rings to said corresponding substrate bonding rings forms a pressure seal interface between said electrical contact(s) and said pressure media and between said ASIC and said pressure media, said pressure media being applied to said front and/or rear sides of sensing die.

14. The method of claim 10, wherein said conductive bonding material comprises solder or a conductive epoxy.

15. The method of claim 10, wherein said bonding rings comprise metalized rings.

16. A method of attaching a sensing die to a substrate comprising
    providing circuitry on said substrate, said circuitry including at least one electrical contact;
    providing a sensing element on said sensing die for sensing a physical property of a media applied to said sensing element, and sensing die circuitry including at least one electrical contact for electrically connecting said sensing die circuitry to said substrate circuitry;

providing at least one bonding ring or portion on the surface of said sensing die;

providing at least one corresponding bonding ring or portion on the surface of said substrate;

providing an ASIC on or in said sensing die or said substrate, said ASIC being programmable to calibrate an output of said sensing element to compensate for temperature effects of said sensing element;

bonding said sensing die electrical contact(s) and said die bonding ring(s) or portion(s) to said corresponding substrate electrical contact(s) and said substrate bonding ring(s) or portion(s), respectively, to thereby form a sensor; and arranging said sensing die bonding ring(s) or portion(s), whereby, bonding said sensing die bonding ring(s) or portion(s) to said substrate bonding ring(s) or portion(s) forms a pressure seal for isolating said electrical contacts and said ASIC from said media applied to said sensing die.

17. The method of claim 16, wherein providing circuitry on said substrate further comprises providing circuitry on a front side of said substrate;

wherein providing an ASIC on or in said sensing die or said substrate further comprises providing said ASIC on a front side said sensing die; and wherein providing at least one bonding ring or portion on the surface of said sensing die further comprises providing a bonding ring on a bonding surface area on the front side of said sensing die and surrounding said sensing element and said sensing die electrical contact(s) whereby, bonding said sensing die bonding ring to said corresponding substrate bonding ring forms a pressure seal interface between said electrical contact(s) and said pressure media and between said ASIC and said pressure media, said pressure media being applied to the rear side of said sensing die.

18. The method of claim 16, wherein providing circuitry on said substrate further comprises providing circuitry on a front side of said substrate;

wherein providing an ASIC on or in said sensing die or said substrate further comprises providing said ASIC on a front side said sensing die; and wherein providing at least one bonding ring or portion on the surface of said sensing die further comprises providing a bonding ring on the front side of said sensing die and surrounding said sensing element, said sensing die electrical contact(s) and said ASIC being located on an area of said sensing die outside of said bonding ring, whereby, bonding said sensing die bonding ring to said corresponding substrate bonding ring forms a pressure seal interface between said electrical contact(s) and said pressure media and between said ASIC and said pressure media, said pressure media being applied to the front side of said sensing die.

19. The method of claim 16, wherein providing circuitry on said substrate further comprises providing circuitry on the front side of said substrate;

wherein providing an ASIC on or in said sensing die or said substrate further comprises providing said ASIC on a front side said sensing die; and wherein providing at least one bonding ring or portion on the surface of said sensing die further comprises:

forming an inner bonding ring on the front side of said sensing die surrounding said sensing element, said sensing die electrical contact(s) and said ASIC being located on an area of said sensing die outside of said inner bonding ring; and forming an outer bonding ring on the front side of said sensing die surrounding said sensing element, said inner bonding ring, said electrical contact(s) and said ASIC;

whereby, bonding said sensing die inner and outer bonding rings to said corresponding substrate bonding rings forms a pressure seal interface between said electrical contact(s) and said pressure media and between said ASIC and said pressure media, said pressure media being applied to said front and/or rear sides of sensing die.

20. The method of claim 16, wherein said bonding rings comprise metalized rings.

* * * * *

UNITED STATES PATENT AND TRADEMARK OFFICE
CERTIFICATE OF CORRECTION

| | | |
|---|---|---|
| PATENT NO. | : 7,635,077 B2 | Page 1 of 1 |
| APPLICATION NO. | : 11/237361 | |
| DATED | : December 22, 2009 | |
| INVENTOR(S) | : Paul C. Schubert | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1092 days.

Signed and Sealed this

Twenty-first Day of December, 2010

David J. Kappos
*Director of the United States Patent and Trademark Office*